United States Patent
Wojnarowski et al.

(10) Patent No.: US 7,683,391 B2
(45) Date of Patent: Mar. 23, 2010

(54) UV EMITTING LED HAVING MESA STRUCTURE

(75) Inventors: Robert Wojnarowski, Ballston Lake, NY (US); Stanton E. Weaver, Northville, NY (US); Steven F. LeBoeuf, Schenectady, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 160 days.

(21) Appl. No.: 10/854,596

(22) Filed: May 26, 2004

(65) Prior Publication Data

US 2005/0264172 A1    Dec. 1, 2005

(51) Int. Cl.
*H01L 33/00*    (2010.01)
(52) U.S. Cl. ............ 257/95; 257/88; 257/E33.005
(58) Field of Classification Search ............ 257/79, 257/88, 95, 98, 99, E33.005
See application file for complete search history.

(56) References Cited

U.S. PATENT DOCUMENTS

| 5,814,416 | A  | * | 9/1998  | Dodabalapur et al. ....... 428/690 |
| 6,084,625 | A  | * | 7/2000  | Yoshida ..................... 347/238 |
| 6,103,542 | A  | * | 8/2000  | Pomp et al. .................. 438/40 |
| 6,188,527 | B1 |   | 2/2001  | Bohn |
| 6,233,267 | B1 | * | 5/2001  | Nurmikko et al. ....... 372/46.014 |
| 6,324,199 | B1 | * | 11/2001 | Capasso et al. .......... 372/45.01 |
| 6,337,493 | B1 |   | 1/2002  | Tanizawa et al. |
| 6,407,411 | B1 |   | 6/2002  | Wojnarowski et al. |
| 6,452,217 | B1 |   | 9/2002  | Wojnarowski et al. |
| 6,635,987 | B1 |   | 10/2003 | Wojnarowski et al. |
| 6,664,560 | B2 |   | 12/2003 | Emerson et al. |
| 6,921,928 | B2 | * | 7/2005  | Sonobe ........................ 257/99 |
| 7,564,064 | B2 | * | 7/2009  | Oohata et al. ................. 257/79 |
| 2005/0087753 | A1 | * | 4/2005 | D'Evelyn et al. ............. 257/98 |
| 2005/0286597 | A1 | * | 12/2005 | Mukoyama et al. ...... 372/50.23 |

\* cited by examiner

*Primary Examiner*—Lynne A. Gurley
*Assistant Examiner*—Colleen A Matthews
(74) *Attorney, Agent, or Firm*—Scully, Scott, Murphy & Presser, P.C.

(57) ABSTRACT

The present invention is directed towards a source of ultraviolet energy, wherein the source is a UV-emitting LED. In an embodiment of the invention, the UV-LED is characterized by a base layer material including a substrate, a p-doped semiconductor material, a multiple quantum well, a n-doped semiconductor material, upon which base material a p-type metal resides and wherein the LED's are provided with a rounded mesa configuration. In a specific embodiment, the p-type metal is positioned upon a rounded mesa, such as a parabolic mesa, formed out of the base structure materials.

28 Claims, 14 Drawing Sheets

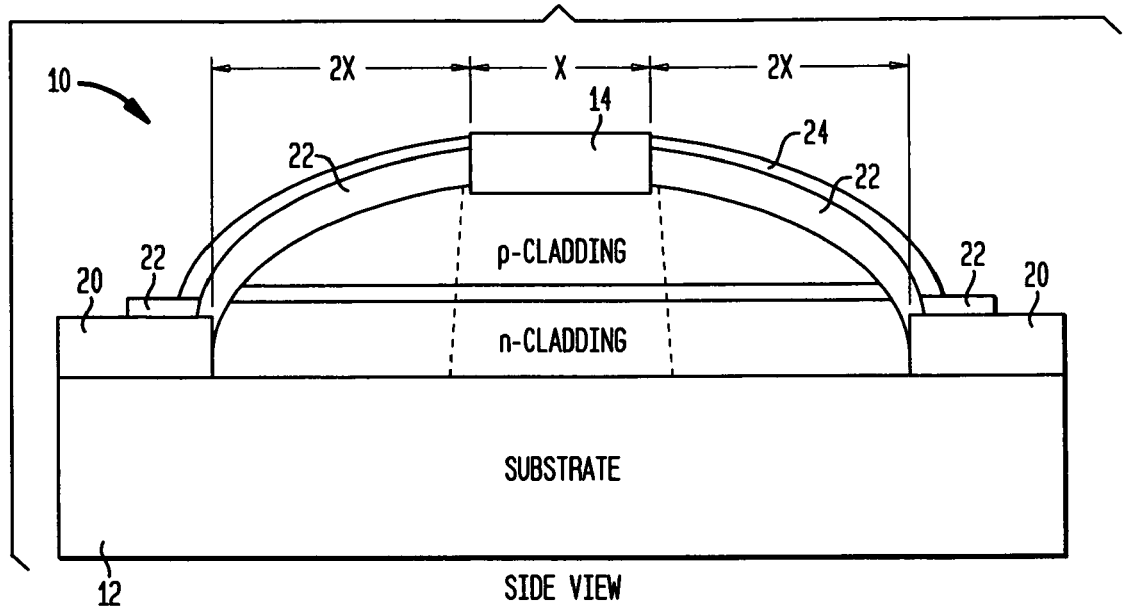
FIG. 1
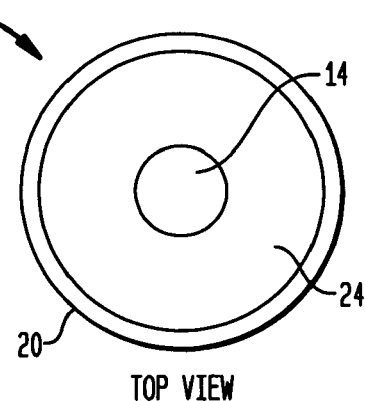
FIG. 1A
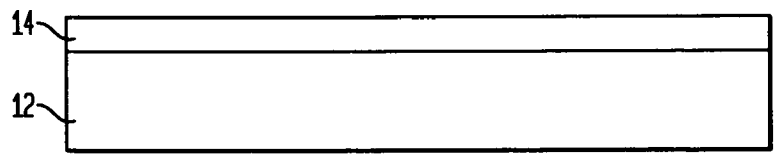
FIG. 2
FIG. 2A

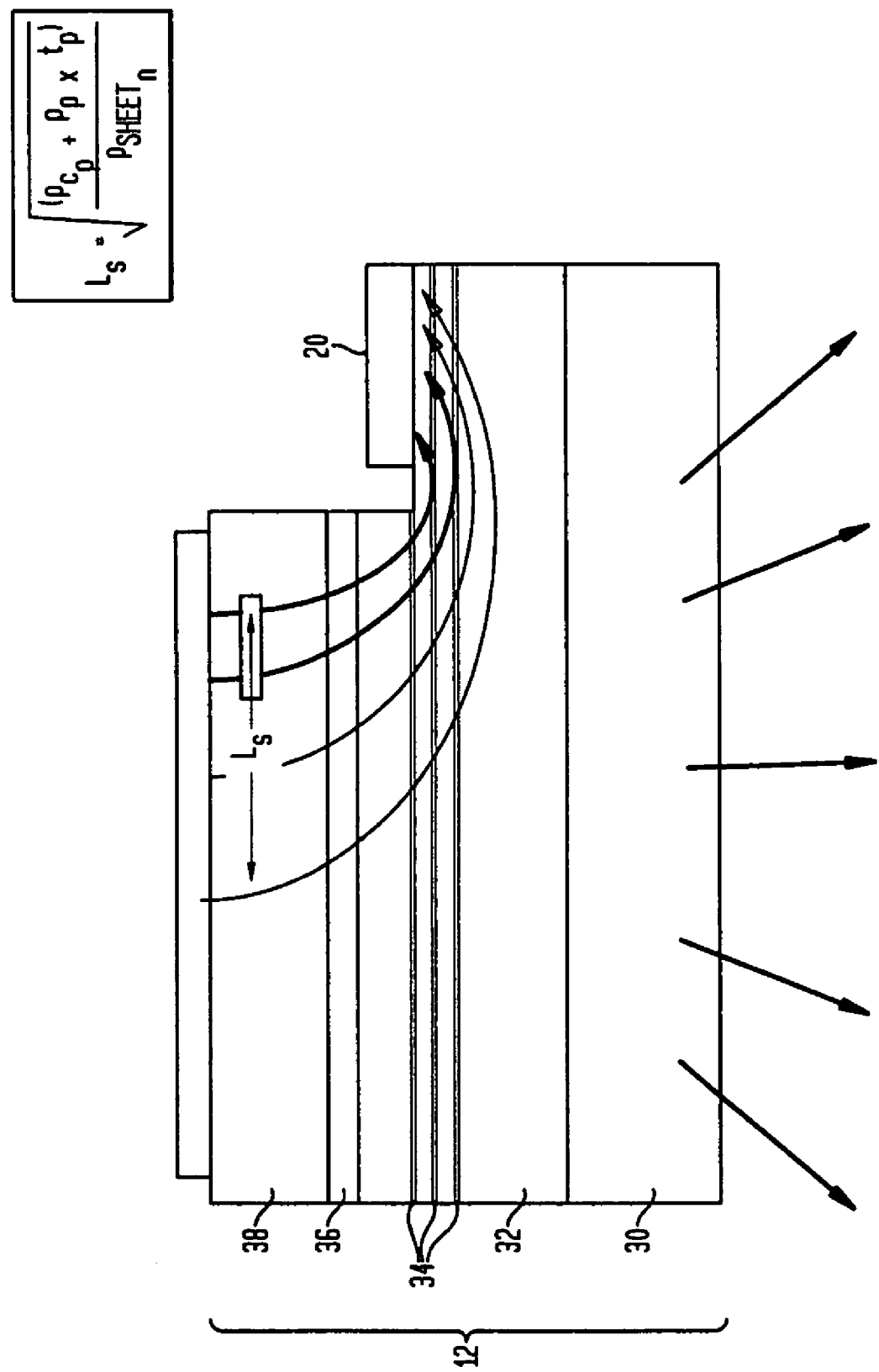

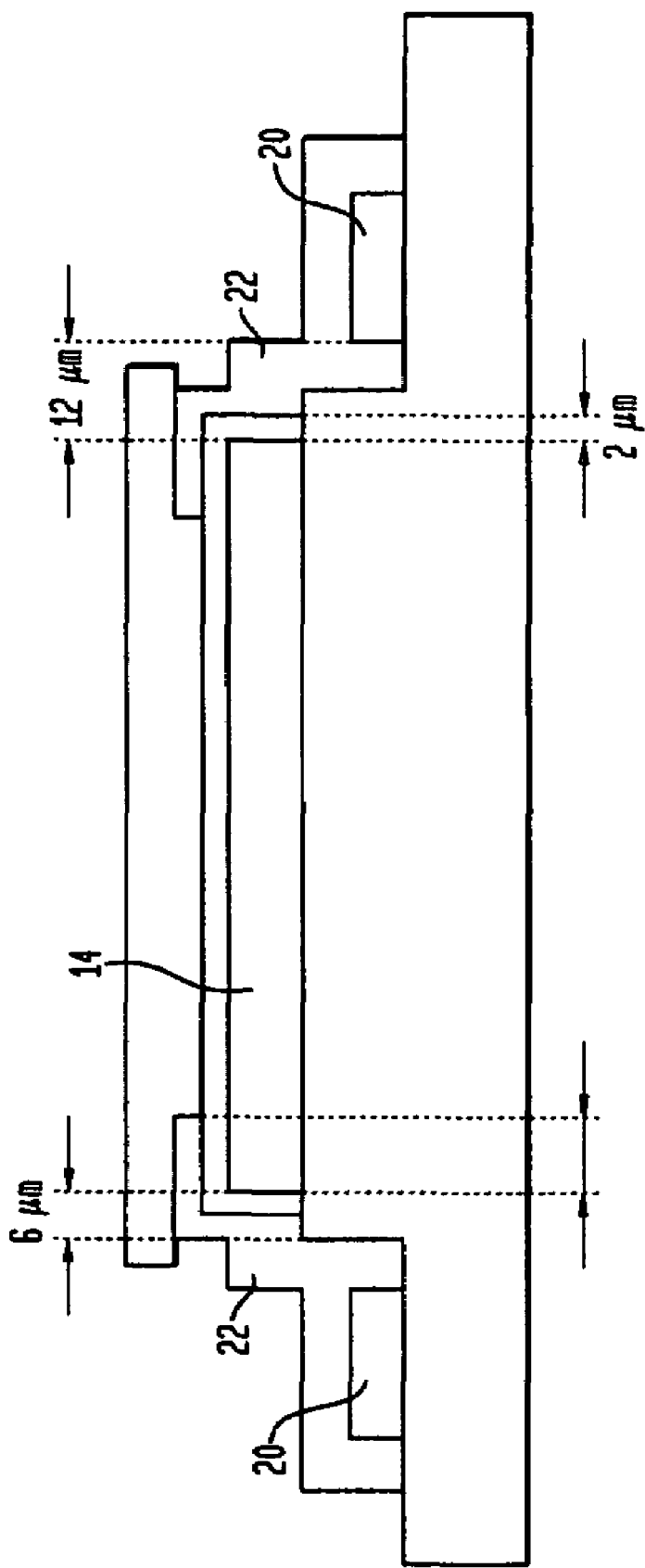

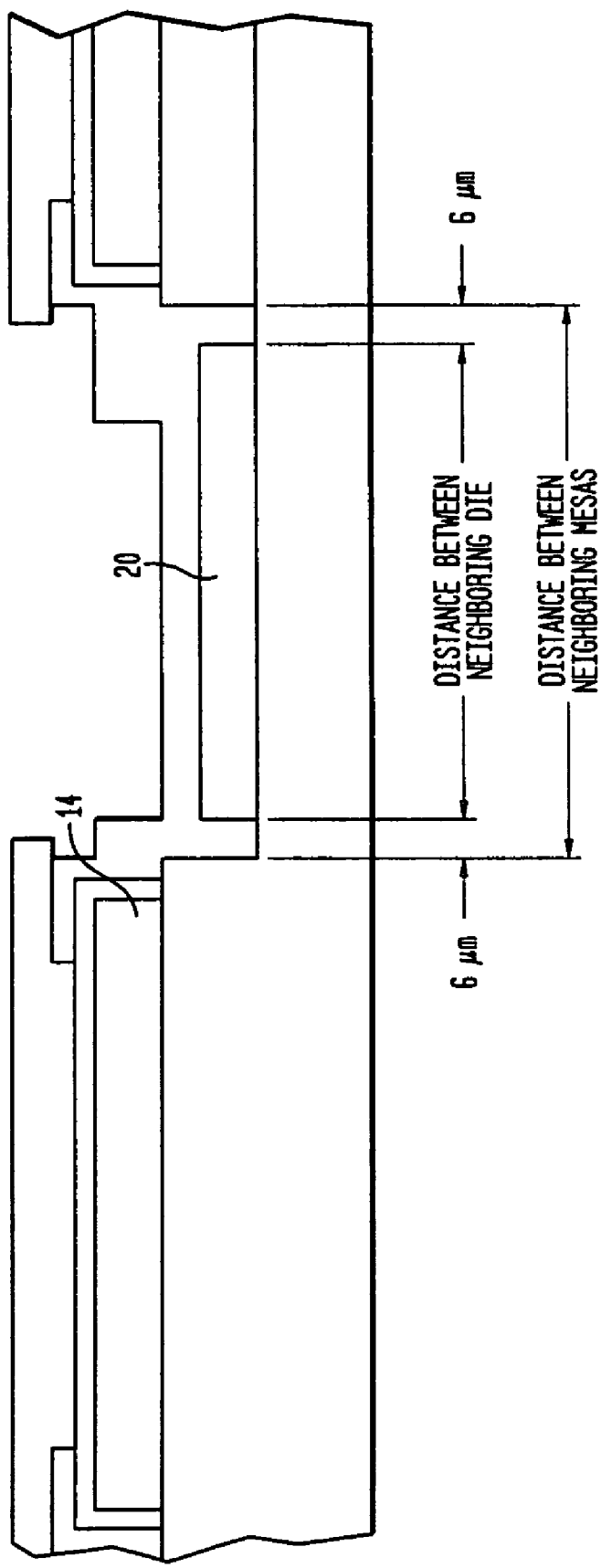

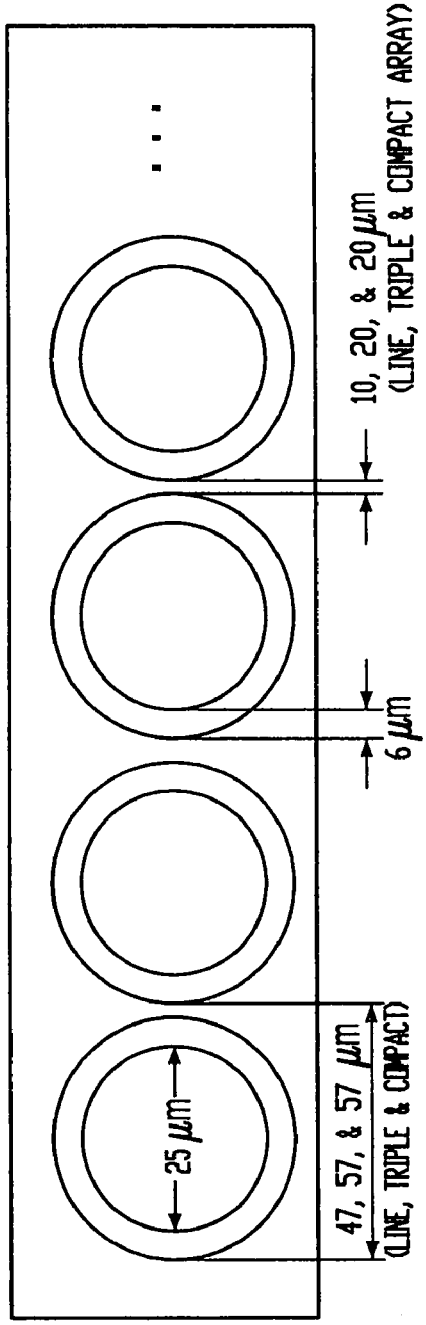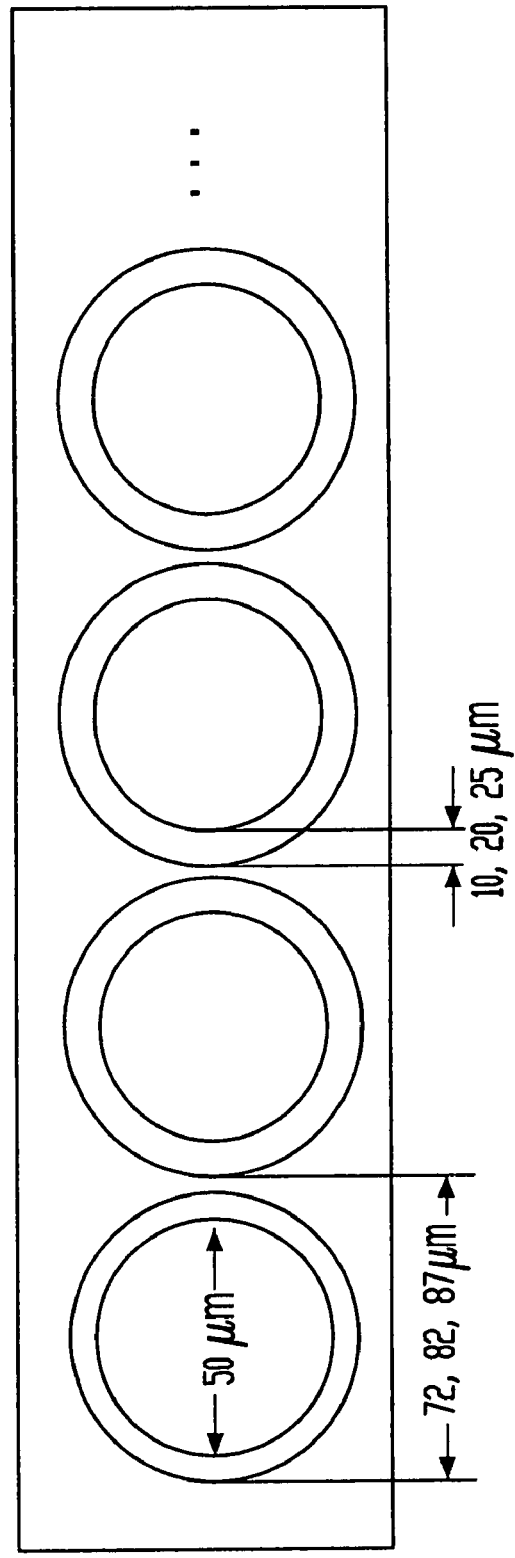

UV EMITTING LED HAVING MESA STRUCTURE

FIELD OF THE INVENTION

The present invention is directed to an LED, and arrays of same. In particular, the LED emits energy in the ultra-violet portion of the electromagnetic spectrum.

STATEMENT IDENTIFYING U.S. APPLICATION

Applicants identify U.S. application Ser. No. 10/609,040, filed Jun. 27, 2003, now U.S. Pat. No. 6,776,474, granted Aug. 17, 2004.

BACKGROUND OF THE INVENTION

Consideration has been given to using single color LED's, such as red, blue or green LED's, in combination with fluorescent and phosphorescent materials to produce another desired color. While certain materials respond fluorescently or phosphorescently to light from the visible portion of the spectrum, and thus would respond to visible LED's, there are a number of materials which respond to the relatively higher-energy photons emitted in the ultraviolet portion of the spectrum. Furthermore, UV-emitting LED's may, in combination with the appropriate phosphor, prove to be a source of white light providing a high level of satisfaction. That is, white light generated from a UV LED and accompanying phosphor may lack the artifacts of a colored light source employed to produce light from an LED emitting in the colored portion of the visible spectrum. For example, this phenomenon is believed to affect blue LED's when used to excite a phosphor during production of white light, where the generated white light is believed to exhibit a blue component. Accordingly, recent interest has focused upon the use of a UV-emitting LED.

At least certain prior art LED devices emit light in directions that may be undesirable, such as through the sides of the diode, as opposed to only substantially through the side preferred for the emission of energy. Depending upon the end use for which the LED is employed, this may not be a problem. However, as indicated, there may be instances where emissions in undesired directions have substantial unwanted consequence, or simply that unidirectional emissions, or substantially unidirectional emissions, are desirable in view of intended end use.

SUMMARY OF INVENTION

The present invention is directed towards a source of ultraviolet energy, wherein the source is a UV-emitting LED. In an embodiment of the invention, the UV-LED is characterized by a base layer material including a substrate, a p-doped semiconductor material, a multiple quantum well, a n-doped semiconductor material, upon which base material a p-type metal resides and wherein the LED's are provided with a rounded mesa configuration. In a specific embodiment, the p-type metal is positioned upon a rounded mesa, such as a parabolic mesa, formed out of the base structure materials. In a more specific embodiment, the UV-LED rounded mesa structure includes n-type metallization layer, passivation layers, and bond pads positioned at appropriate locations of the device. In a more specific embodiment, the p-type metal layer is partially encapsulated in the encapsulating layer.

In yet another embodiment, LED's as described above, having preselected diode diameters not exceeding about 100 μm, are incorporated into devices in preselected patterns, which allow the artisan to adjust the output from the device and/or minimize, if not eliminate, undesired effects that result where an object enters the field of emission, and such object would otherwise interfere with the emission of light.

It is believed that the structures described herein are capable of transmitting a collimated band of energy, which is desirable for devices in which narrow transmission bands are desired. For example, a device of the present invention, emitting collimated energy, may be employed in a device detecting the presence or absence of a given thing, and/or for the measurement of same, where for instance, the presence, absence, or measurement of that phenomena is in some way related to the measurement of the emission after it encounters (or does not encounter) the thing to be detected or measured. In these instances, generalized emissions (such as through the side of the device), could render the measurement less accurate or reliable.

Also, it is believed that output from the diodes of the present invention are substantially limited to the UV-portion of the electromagnetic spectrum. In other words, the output is substantially devoid of emissions in the visible portion of the spectrum, such as visible light in the yellow portion of the spectrum.

In another aspect of the present invention, LED's of the present invention are arrayed in linear, triple, and compact arrays, as described herein. In a more specific embodiment of the invention, the LED's are circular in shape, having diameters not exceeding about 100 μm., and are spaced by an appropriate amount of n-metallization layer.

In another aspect of the invention, the LED's of the present invention have mesas which are provided with a rounded surface contour resembling, for example, a hemisphere or parabola, an ellipse, or combinations thereof.

In one aspect, the term "collimated" light or energy refers to a parallel or substantially parallel band of energy emitted from its diode source, with lateral energy spreading, away from the cross-sectional area of the diode, limited to approximately 15° as measured radially from a line extending from the edge of the emission source, in the direction of the emitted energy.

BRIEF DESCRIPTION OF THE FIGURES

FIG. 1 is a LED of the present invention, depicted in cross-section;

FIG. 1a is a top plan view of the LED of the present invention;

FIG. 2 depicts the formation of a LED of the present invention, in cross-section, at a relatively early stage of production;

FIG. 2a is a top plan view of the LED depicted in FIG. 2;

FIG. 8 is a cross-sectional view of a substrate employed in the LED of the present invention;

FIG. 9 is a cross sectioned view of a circular LED of the present invention;

FIG. 10 is a cross sectioned view of adjacent LED's (and the region between them);

FIG. 11 is a top plan view of about 25 μm diameter circular diodes;

FIG. 12 is a top plan view of about 50 μm diameter circular diodes;

DETAILED DESCRIPTION OF THE INVENTION

Figure 3:
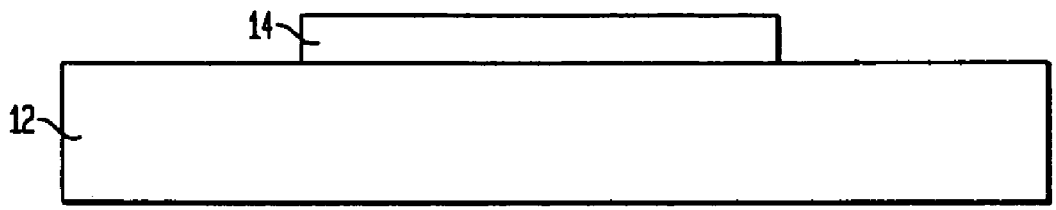
FIG. 3 depicts the formation of a LED of the present invention, in cross-section, subsequent to the FIG. 2 depiction.

An LED 10 of the present invention is depicted in FIG. 1. It should be understood that the LED will be incorporated into arrays including a plurality of LED's, which is discussed and shown later in this disclosure.

LED 10 includes the following components: base layer 12, p-metal layer 14, encapsulant 16, mesa 18, n-metallization layer 20, passivation layer 22, p-bond pad 24 and n-bond pad 26 (26 not shown in FIG. 1).

Base layer 12 is a multiple component element. As depicted in FIG. 8, base layer 12 includes a substrate 30, such as a substrate of sapphire, silicon carbide, zinc oxide, gallium nitride, and any combination of a gallium nitride-aluminum-indium alloy of the formula $Al_x In_y Ga_{1-x-y}N$, wherein x +y<1, and GaAF. The substrate can also be silicon, AlN, InN, AlIn with any alloy combination, lithium gallate, etc. An epitaxial layer of an n-doped containing material 32 is deposited upon the substrate 30. The n-doped material may be any conventional material, such as GaN doped with silicon. As shown in FIG. 8, a silicon dopant is present in one or more delta doped layers, that is, one or more discreet layers 34 of dopant. A delta-doped arrangement may be advantageous in terms of promoting structural integrity of the device and/or facilitating spreading of current through the base structure. However, other doping schemes may be employed instead of delta doping. An active region of multiple quantum wells (MQW's) 36 is positioned upon the n-cladding layer. MQW's may be constructed of material known to be suited for this purpose, such as alternating layers of undoped indium gallium nitride and gallium nitride, doped or undoped. A layer of p-doped material 38, such as GaN doped with Mg, is deposited upon the MQW layer.

Group III-nitride epitaxial films are typically deposited using MOCVD (metal organic chemical vapor deposition), MBE (molecular beam epitaxy), HVPE (hydride vapor phase epitaxy) or other epitaxial deposition technique.

Before epitaxy, the precleaned wafers are annealed at high temperature in hydrogen and subsequently in ammonia. An optional template layer for nucleation, followed by a III-nitride template layer, are then deposited. A cladding layer is then deposited (typically n-cladding) followed by an active region (typically a multiple quantum well) a blocking layer (typically undoped) and another cladding layer (typically p-doped). The cladding layers are either uniformly doped, delta-doped, or grown as doped superlattices. N-type doping usually involves Si incorporation whereas p-type doping usually involves Mg incorporation.

Fabrication usually begins with a surface cleaning using solvents (for degreasing) and acids (for metal and oxide removal). Patterning of all mask levels is readily done with standard photoresist-based microfabrication techniques. The p-contact metallization (typically Ni, Pt, Ag, or Ni/Au) is typically defined first using e-beam evaporation or sputtering. If a rounded (i.e., parabolic, elliptical, spherical) mesa is fabricated, then it may be so done using reactive ion etching (RIE) and inductively coupled plasma (ICP) etching with a chlorine-based chemistry. N-contact metallization (typically Ti/Al) is then deposited using e-beam evaporation or sputtering, followed by passivation (typically sputtered $SiO^2$) and bond metal deposition (typically Ni/Au).

Devices are typically packaged using GE COB (Chip On Board) flip-chip technology to avoid a silicon submount. In this case, the chip is mounted directly to a PCB board with solder bumps.

Turning now to FIGS. 2-7, and then back to FIG. 1, a process for fabricating LED's of the present invention and arrays of same, shall be described. FIG. 2 depicts a p-metal layer 14 deposited over the base layer 12. P-metal layer may be selected from nickel, rhodium, silver, aluminum, palladium or alloys of same, alloys of Ni—Au, NiO—Ag, indium-tin-oxide alloys and silver oxide, to enumerate just a few suitable materials.

FIG. 3 depicts the device after the p-metal 14 layer has been formed into circular diodes. It should be noted that other diode shapes may be employed, depending upon the intended usage of the completed structure. The p-metal may be formed by applying a photoresist layer (either positive or negative photoresist) that has been patterned upon the p-metal layer, with openings provided in the photoresist to correspond to locations where p-metal is to be removed. After developing the resist, the device is subjected to a wet etch in order to remove the p-metal at derived locations. Subsequent to etching, the photoresist is removed from the device. While one diode is shown in FIG. 3, it will be appreciated that in many instances a plurality of diodes will be formed the base layer 12, in accordance with the desired diode diameter, pattern, and spacing of same as described later in this disclosure.

Figure 3A:
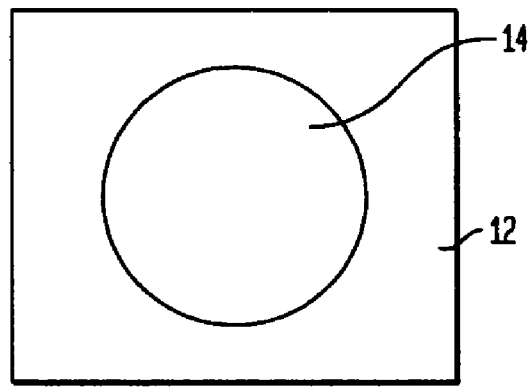
FIG. 3a is a top plan view of the LED depicted in FIG. 3.

The p-metal can be patterned by dry etching techniques, such as reactive ion etching (RIE) and inductively coupled plasma (ICP) etching. As shown in FIG. 3a, the p-metal has been patterned into a circular shape, while other shapes can be employed, circular diodes are well suited to the production of a source of collimated light.

Figure 4:
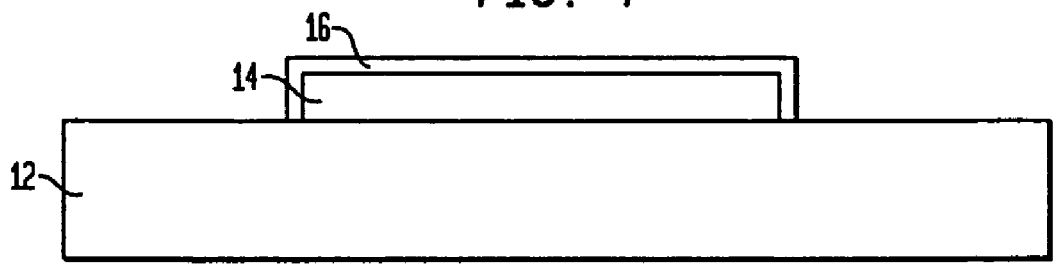
FIG. 4 depicts the formation of a LED of the present invention, in cross-section, subsequent to the FIG. 3 depiction.
Figure 4A:
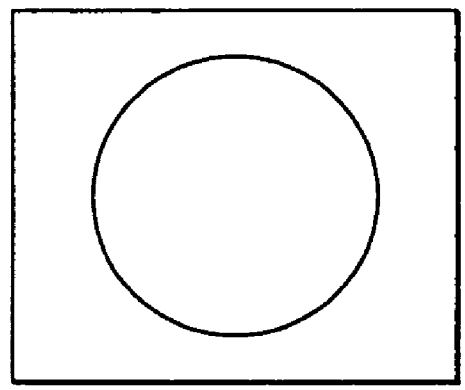
FIG. 4a is a top plan view of the LED depicted in FIG. 4.

FIG. 4 depicts the device after an encapsulant 16 has been applied over and encapsulates the p-metal layer. The encapsulating layer may be applied by standard photolithographic techniques employing a positive or negative photoresist patterned into a mask, development of the mask, application of the encapsulating material, and removal of the mask. A Ti—W alloy may be employed as the material for the encapsulating layer.

Figure 5:
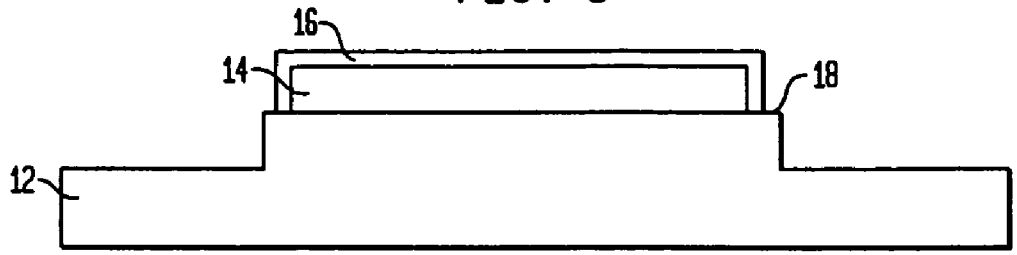
FIG. 5 depicts the formation of a LED of the present invention, in cross-section, subsequent to the FIG. 4 depiction.
Figure 5A:
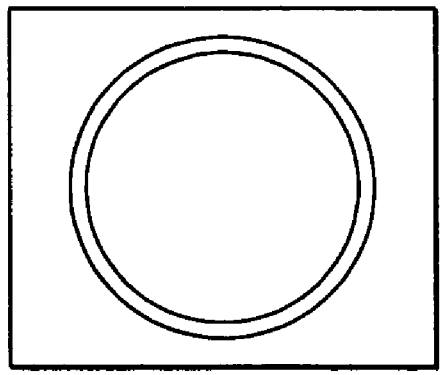
FIG. 5a is a top plan view of the LED shown in FIG. 5 depiction.

FIG. 5 shows device 10 after formation of the mesa 18. As shown, mesa 18 is formed where a preselected portion of base layer 12 is removed from around the p-metal layer 14. Mesas can be formed by patterning a resist (either positive or negative) upon the device, developing the resist in pre-selected areas, removal of undeveloped resist and subsequently etching (via wet or dry techniques), portions of substrate selected for removal. ICP etching or RIE etching have been found to be well suited for this process step.

As shown in FIG. 8, when forming the mesa in the substrate 30, a portion of the n-doped containing material, active region 36, and p-doped containing material 38 have been removed. However, other arrangements are possible, where only a portion of p-doped material 38 and/or active region 36 are removed during mesa formation. Also, it should be noted that the arrangements other than shown in FIG. 8 are possible, wherein for example, the location of the n-doped layer and p-doped layer are reversed, and/or additional doped or undoped layers are present.

Figure 6:
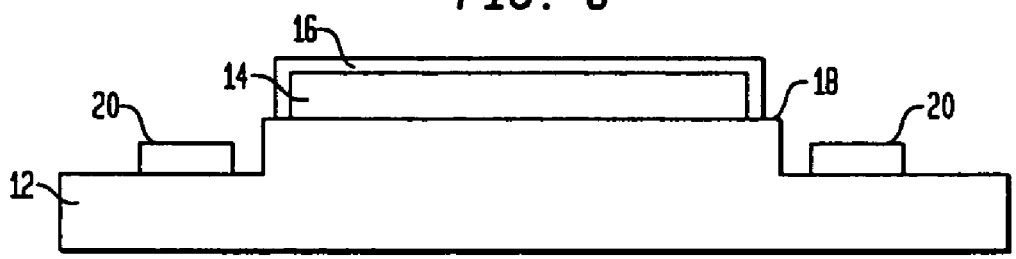
FIG. 6 depicts the formation of a LED of the present invention, in cross-section, subsequent to the FIG. 5 depiction.

FIG. 6 depicts the device after n-metal layer 20, such as titanium, aluminum, titanium-aluminum alloy, titanium tungsten aluminum alloy, tantalum alloy, or tantalum has been deposited upon the device. A resist is applied to the device, developed at selected locations, removed at undeveloped locations, and the n-metal is deposited in the desired areas. The resist is then removed from the device.

Figure 6A:
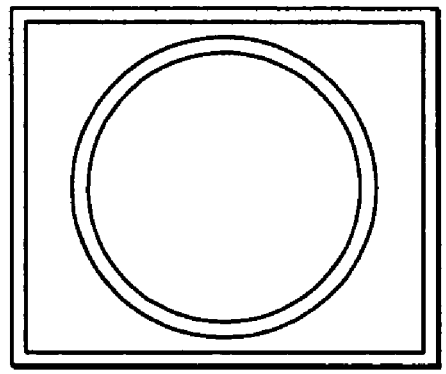
FIG. 6a is a top plan view of the LED shown in FIG. 6.

The n-metal layer is deposited so as to enclose the p-metal layer and mesa within a boundary of n-metal layer, as depicted in FIG. 6a. Sizing of the p-metal layer, and spacing from the p-metal layer and mesa edge, will be discussed later in this disclosure.

As shown in FIG. 6, the n-metal layer has been deposited on the same side of the base layer on which the p-metal has been deposited. This arrangement is employed where a non-conductive material, such as sapphire, is employed as substrate 30. Where the base layer is an electrically conductive material, such as the silicon carbide, $Al_xIn_yGa_{1-x-y}N$ alloys discussed previously, the n-contact layers may be formed on the side of the substrate opposite the side on which the p-metal layer is positioned.

Figure 7:
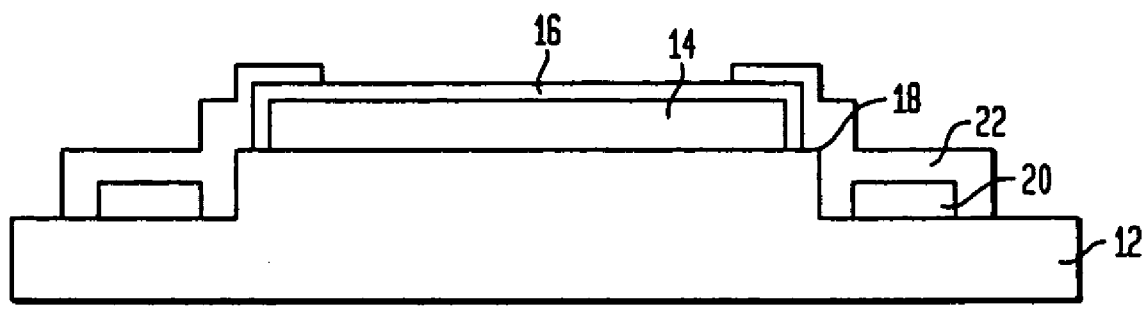
FIG. 7 depicts the formation of a LED of the present invention in cross-section, subsequent to the FIG. 6 depiction.
Figure 7A:
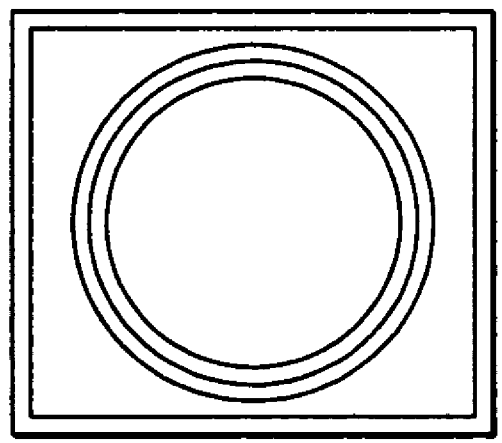
FIG. 7a is a top plan view of the LED shown in FIG. 7.

FIG. 7 depicts the device after formation of a passivation layer 22, which may be a layer of $SiO_2$, SiN, or any suitable oxide or nitride. Passivation layer 22 is positioned over the n-metal contact and extends over the mesa edge to partially encapsulate the p-metal layer 14, with an opening in the passivation layer provided in the top in order to provide electrical contact between p-bond pad and the p-metal layer. The passivation layer may be deposited in accordance with photolithographic techniques previously disclosed, with subsequent removal of the mask.

FIG. 1 shows the LED after the p-bond pad 24 has been formed to contact the p-metal layer 14. The bond metal can be a non-transparent, reflective material, such as NiAu, in which case the light generated by the diodes is reflected by the p-pad metal and exits the back of the device. However, arrangements wherein the bond pad is transparent, allowing light to exit the top of the device, are acceptable. A transparent bond pad can be constructed of thin layers of nickel, platinum, silver, alloys of NiO—Au, alloys of In—Sn—O, AgO, rhodium, palladium or platinum. The p-bond pad may be deposited in a grid type pattern to facilitate the transmission of light through the bond pad. The p-bond pad may be applied in accordance with conventional photolithographic techniques as described herein, including wet etching or dry etching after application and development of a mask patterned from a photoresist. The p-bond pad electrically connects the diode to an electric source.

The applicants have learned that, where the diode is circular and has a diameter of about 25 µm (as defined by the mesa), the passivation layer 22 should overlap with the p-metal layer 14 for about 2 µm on the upper side of the p-metal layer. See FIG. 9. For diodes of larger diameters (e.g. about 50 µm and about 100 µm (as defined by the mesa)), the passivation layer/p-metal layer overlap should be about 5 µm.

Figure 13:
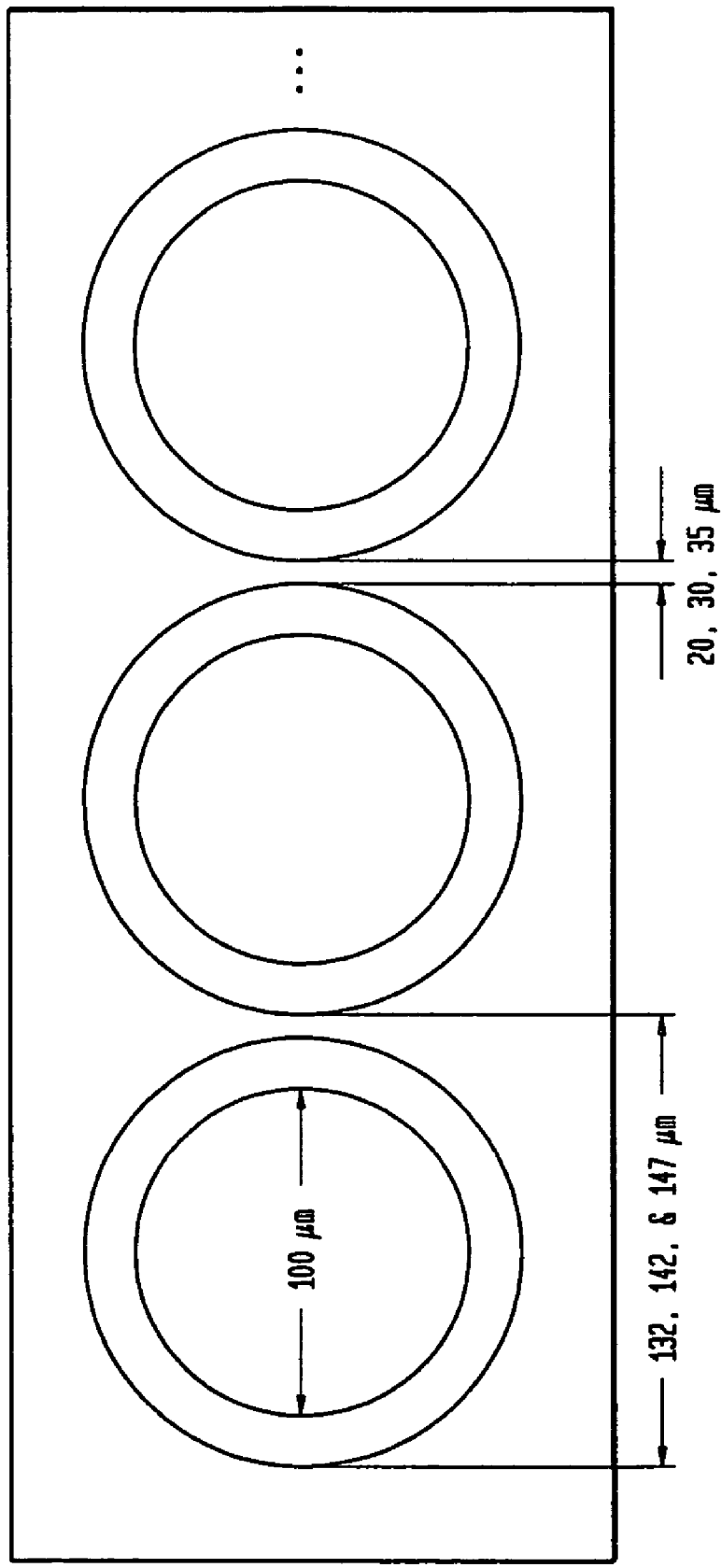
FIG. 13 is a top plan view of about 100 μm diameter circular diodes.
Figure 14:
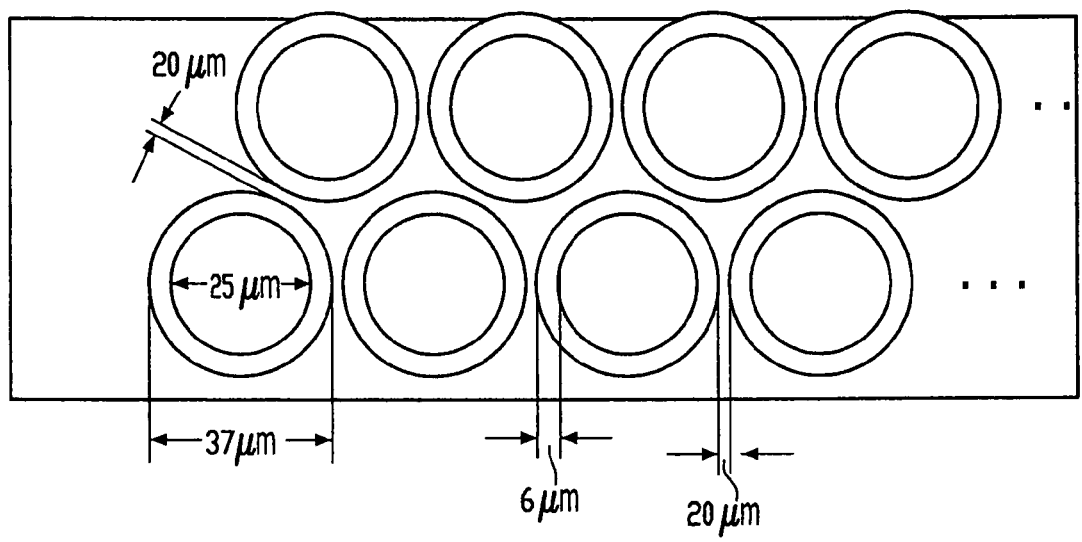
FIG. 14 is a top plan view of about 25 μm diameter circular diodes in triple array.

The applicants have further found that the linear distance occupied by the n-metal layer, as measured laterally, between adjacent diodes (See FIG. 10), is dependent upon on diode diameter. For example, where an array of about 25 µm diameter diodes are arranged in a linear array, about 10 µm of n-metal should be present (a linear array is what its name implies, a number of diodes arranged in a single line). About 20 µm of n-doped metal should be present between arrays of about 25 µm circular diodes in a triple, compact, or an offset linear array. See FIGS. 11 and 14. (A triple array is arrangement of two lines of diodes. The diodes of one line may be may be offset from the diodes of the other line. A compact array is an arrangement of four or more lines of diodes. The diodes of a given line may be offset from the diodes of adjacent line or adjacent lines. An offset linear array is an arrangement of three lines of diodes. The diodes of a given line may be offset from the diodes of adjacent line or adjacent lines.) For about 50 µm diameter diodes in a linear array, about 10 µm of n-metal layer should be present between adjacent diodes. See FIG. 12. About 20 µm should be present between about 50 µm diodes arranged in a triple array or an offset linear array, and about 25 µm of n-metal should be present between adjacent about 50 µm diodes arranged in a compact array. See FIG. 12. For about 100 µm circular diodes, about 20 µm of n-metal layer should be present between adjacent diodes arrayed in a linear array, about 30 µm of n-metal should be present between adjacent diodes arranged in a triple array or an offset linear array, and about 35 µm of n-metal should be present between adjacent diodes arranged in a compact array (see FIG. 13). The guidelines set forth above are summarized in Table 1 below.

TABLE 1

| | Array Type | | |
| --- | --- | --- | --- |
| | Linear | Triple | Compact |
| 25 µm | 10 | 20 | 20 |
| 50 µm | 10 | 20 | 25 |
| 100 µm | 20 | 30 | 35 |

The applicants have found that, for compact arrays, a 10×10 arrangement is well suited for about 25 µm diodes. For about 50 µm and about 100 µm diodes, the arrangements may be, respectively, 7×7 and 4×4.

The applicants have further found that the distance between the p-metal layer 14 and edge of the mesa 18 should be about 6 µm (see, e.g. FIGS. 9 and 11), and that the distance between the n-metal layer 20 to the mesa 18 should be about 6 µm. Thus, about 12 µm should be present between the p-metal and the n-metal layer. This arrangement is well suited for linear arrays, compact arrays, and triple arrays.

FIGS. 11 through 14 illustrate circular diodes arranged in linear arrays and in triple arrays. Linear arrays are effective at emitting energy over a concentrated area however, such area is relatively narrow. Arrangements such as compact arrays or triple arrays broaden the area over which energy is emitted, however the emissions tend to be more efficient (as a function of current applied to the diodes) where diodes are smaller and the number of rows of diodes are relatively few. Thus, it may be appreciated that the triple array arrangement provides a relatively fair balancing of two desirable attributes: providing a fairly broad area of coverage and a fair degree of efficiency of energy output based on applied current. Further, as the desired UV focal feature for particle detection is a narrow line width greater than or equal to a single particle diameter and smaller than twice the diameter of a single particle, linear arrays allow for a dense focal line beam to be imaged with simple optics.

Figure 15:
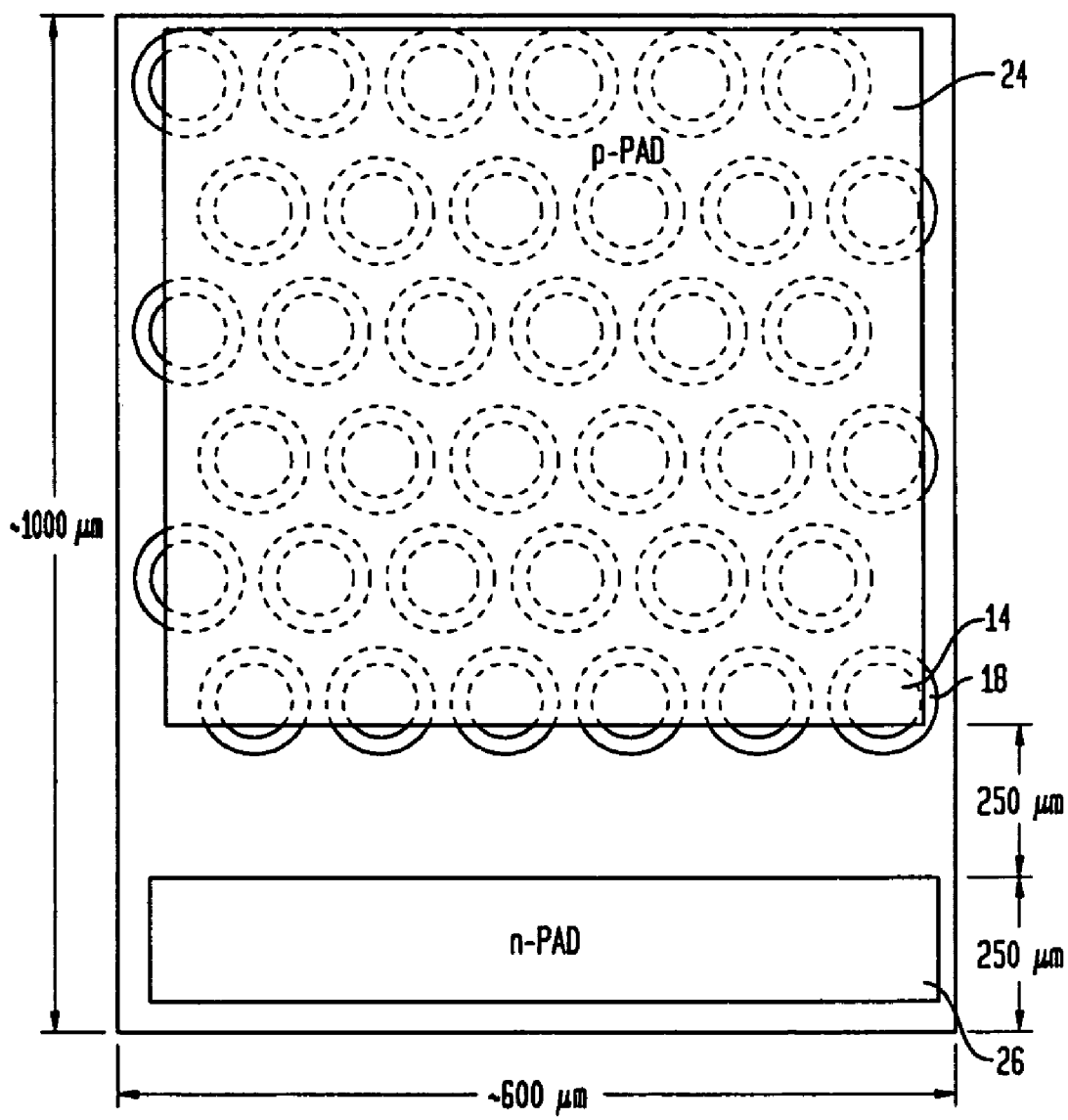
FIG. 15 is a top plan view of a compact array.
Figure 16:
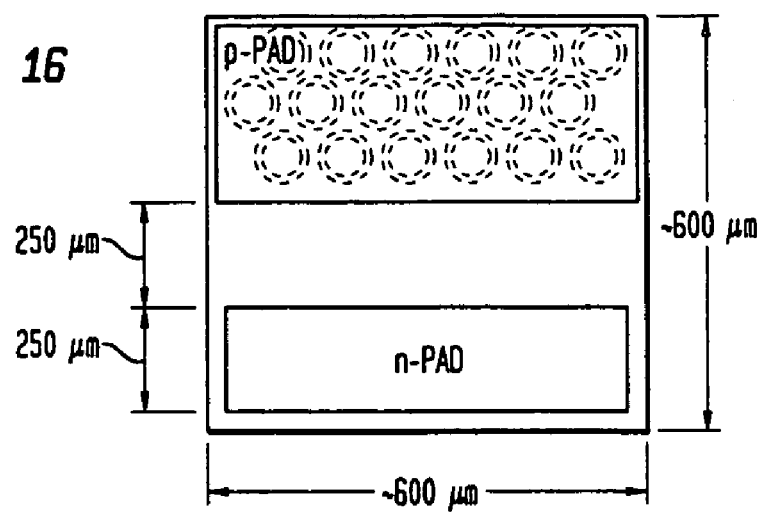
FIG. 16 is a top plan view of an offset linear array.

For linear arrays, diodes with diameters of about 25 μm, 50 μm, 100 μm, about 10, 7, and 4 diodes (respectively) in a line are acceptable arrangements. FIG. 15 demonstrates a compact array format arrayed upon a substrate having approximate dimensions of about 1000 μm×about 600 μm. Suitable array formats are for about 25 μm diodes, 10×10, for about 50 μm diodes, 7×7, and about 100 μM diodes, 4×4. Approximate spacing between the positive bond pad 24 and negative bond pad 26 in approximately about 250 μm, as shown in FIG. 16. The negative bond pad is positioned on or within the substrate, and makes electrical contact with the n-metal, which is formed upon the substrate in a manner that permits it to contact the n-pad and complete the circuit.

FIG. 16 shows an offset linear array arranged upon a substrate having approximate dimensions of about 600 μm×about 600 μm. Suitable array formats are, for about 25 μm diodes, 3×10, for about 50 μm diodes, 3×7, and for about 100 μm diodes, 3×4. Spacing between the diodes is as indicated previously. Approximate spacing between the positive bond pad 24 and the negative bond pad is about 250 μm. Offset linear arrays, where the lines of diodes are offset, provide a firewall effect to decrease, if not eliminate, the possibility that a particle traveling through the field of emission will not encounter emitted UV-energy. Such an arrangement is well suited to a detection system where the encounter between a particle and emitted energy will result in a measurable effect.

As shown in the figures, the diodes of adjacent rows are offset by the length of one-half mesa. However, the diodes may be offset in other arrangements, such as one-third to one-half mesa in length.

Figure 17:
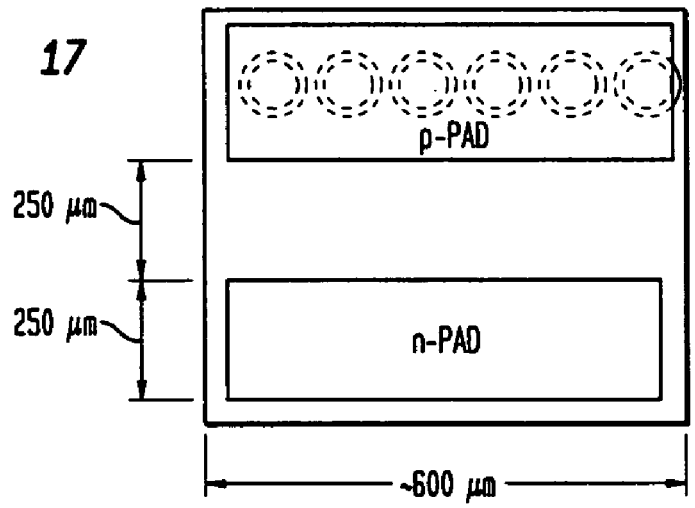
FIG. 17 is a top plan view of a single linear array.

FIG. 17 shows a single linear array shown in a substrate having approximate dimensions of about 600 μm×about 600 μm. Suitable arrangements are, for about 25 μm diameter diodes, 10 diodes, for about 50 μm diodes, 7 diodes and for about 100 μm diodes: 4 diodes.

Figure 18:
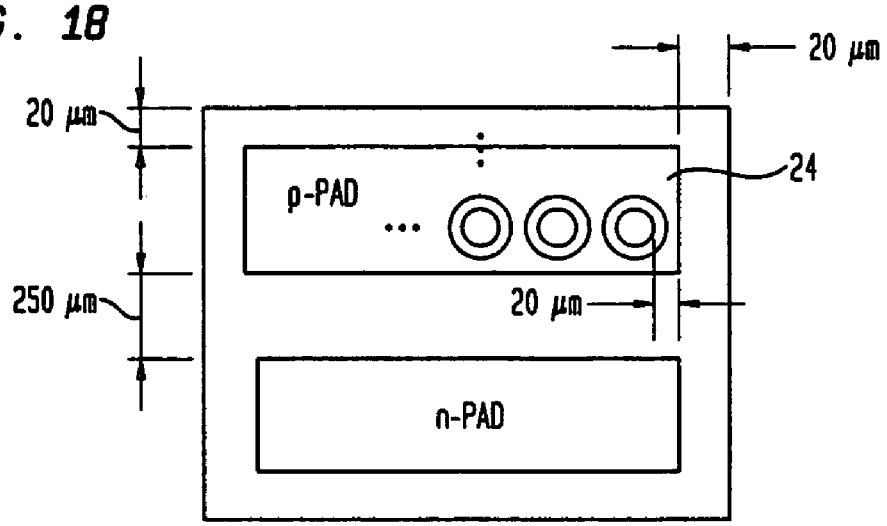
FIG. 18 is a top plan view depicting a particular arrangement.

The applicants have learned that the p-bond pad metal 24 should be distanced about 20 μm from the n-metallization metal. Also, the pad metal should cover the p-metal by about 20 μm from the edge of the p-metal. See FIG. 18.

Figure 19:
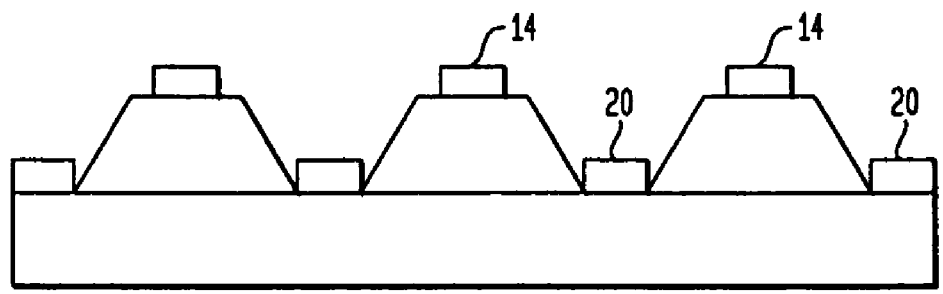
FIG. 19 is a cross sectioned view of an embodiment of the present invention.

FIG. 19 depicts a side view of a plurality of diodes, with the passivation layer not shown. Here, the mesas resemble truncated triangles with the p-metal layer 14 situated at the peak and the n-metal situated in the valleys.

Figure 20:
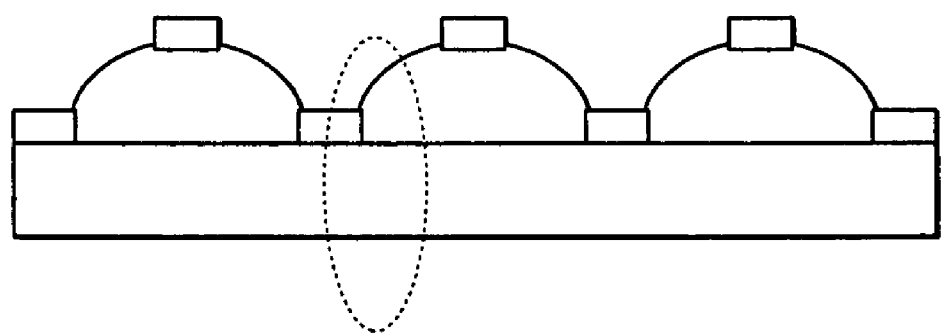
FIG. 20 is a cross sectional view of an embodiment of the present invention.
Figure 21:
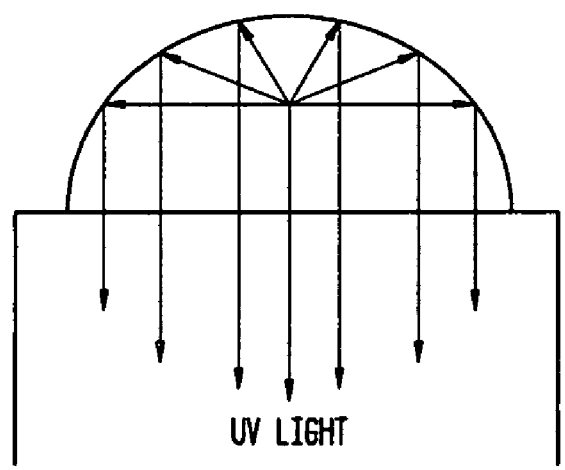
FIG. 21 is a cross sectional view depicting collimation in the LED's shown in FIG. 20.

FIG. 20 depicts a plurality of diodes wherein the sidewalls of the mesas are rounded. A rounded arrangement may be advantageous in terms of collimating the transmission of light, as shown in FIG. 21. That is, where the sidewalls of the mesas are rounded, substantially all light emitted from the center of the diode. Rounded mesa sidewalls can be produced by engaging in a reflo process prior to etching.

Mesa height should be about 500 Å to about 20 μm, with about 500 Å being well suited for producing collimated light.

As further shown in FIG. 1, it has been found that a specific arrangement in which the distance between the edges of the p-contact and n-contact is about twice (2×) the edge-to-edge distance (x) of the p-contact yields collimated light.

Due to the high resistivity of the p-cladding layers, i.e.—sheet resistance typically greater than 10,000 ohms per square, the active region is defined largely by the size of the p-contact metallization.

Figure 22:
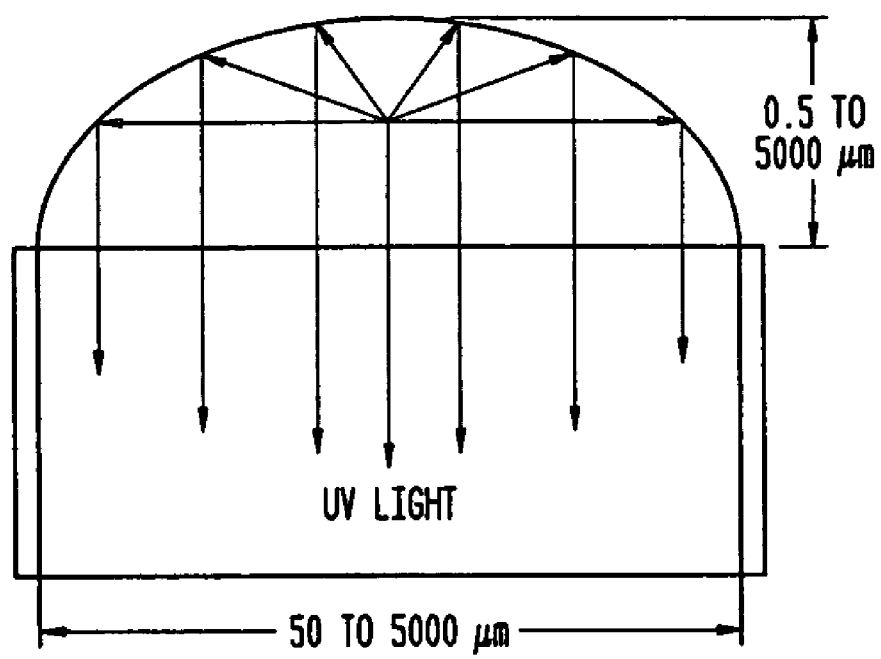
FIG. 22 is a cross sectional view of a rounded mesa depicting aspects of a specific embodiment.
Figure 23:
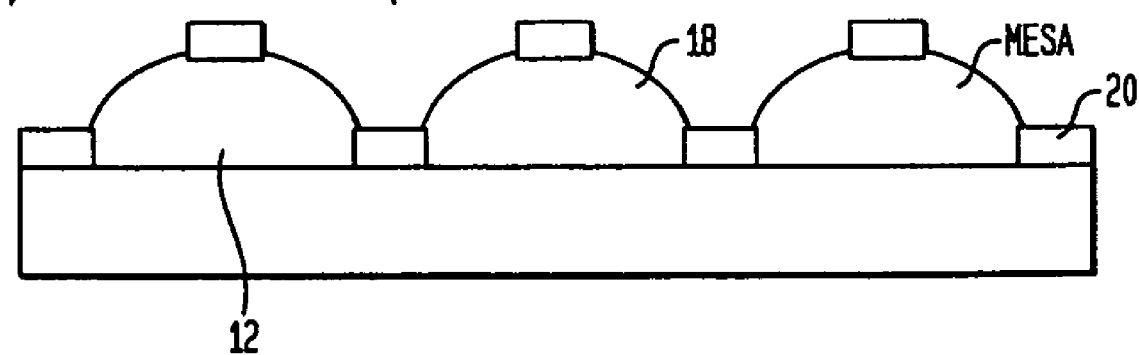
FIG. 23 is a cross sectional view of a plurality of rounded mesas of the present invention.

As shown in FIG. 22, the good results are obtained when the height of the rounded region of the mesa is about 0.5 to about 5000 μm. Also the edge-to-edge distance of the mesa should be about 50 to about 5000 μm.

We claim:

1. A LED emitting UV energy comprised of a substrate having:
   a base layer;
   an active region;
   a p-doped region;
   an n-doped region;
      wherein the LED is formed into a mesa;
   a p-metallization region is positioned on the mesa;
   an n-metallization region is positioned in a depression on the substrate;
      wherein the p-metallization layer and n-metallization layer are in contact with electrical contacts;
   wherein the LED is provided with an outwardly rounded upper surface contour in a cross section taken along the plane perpendicular to the substrate.

2. The LED of claim 1 wherein p-metallization region and n-metallization have edges and the distance between the edges of the p-metallization region and n-metallization region is about twice the edge-to-edge distance of the p-metallization region.

3. The LED of claim 1 wherein the rounded surface contour of the mesa has a height of about 0.5 to about 5000 μm.

4. The LED of claim 1 wherein the mesa is provided with edges and the edge-to-edge distance of the mesa is about 50 to about 5000 μm.

5. The LED of claim 1 wherein the LED is further comprised of a passivation layer encasing at least a portion of a region including the p-metallization layer, mesa, and n-metallization layer.

6. The LED claim 1 wherein the mesa is circular in shape and has a diameter selected from about 25 μm, about 50 μm, and about 100 μm.

7. A plurality of LED's of claim 1 wherein the n-metallization layer and p-metallization layer are spaced by about 12 μm.

8. The LED of claim 1 wherein the LED shape, in cross-section, is parabolic.

9. The LED of claim 1 wherein the LED shape, in cross-section, is elliptical.

10. The LED of claim 1 wherein the LED shape, in cross-section, is hemispherical.

11. The LED of claim 1 wherein the p-metallization layer is embedded within an encapsulated layer selected from Ti—W alloy, W, Co, Mo, Cr, and other refractory metals.

12. The LED of claim 11 wherein the LED is further comprised of a passivation layer encasing at least a portion of a region including the encapsulating layer, mesa, and n-metallization layer.

13. A plurality of LED's of claim 1 arranged in a linear array.

14. The linear array of claim 13 wherein the mesas of the LED's have a circular diameter of about 25 μm and about 10 μm of n-inetallization layer is present between mesas.

15. The linear array of claim 13 wherein the mesas of the LED's have a circular diameter of about 50 μm and about 10 μm of n-metallization layer is present between mesas.

16. The linear array of claim 13 wherein the mesas of the LED's have a circular diameter of about 100 μm and about 20 μm of n-metallization layer is present between mesas.

17. A plurality of LEDs of claim 1 arranged in a triple array.

18. The triple array of claim 17 wherein the mesas of the LED's have a circular diameter of about 25 μm and about 20 μm of n-metallization is present between mesas.

19. The triple array of claim 17 wherein the mesas of the LED's have a circular diameter of about 50 μm and about 20 μm of n-metallization is present between mesas.

20. The triple array of claim 17 wherein the mesas of the LED's have a circular diameter of about 100 μm and about 30 μm of n-metallization is present between mesas.

21. A plurality of LEDs of claim 1 arranged in a compact array.

22. The compact array of claim 21 wherein the mesas of the LED's have a circular diameter of about 25 μm and wherein about 20 μm of n-metallization is present between LEDs.

23. The compact array of claim 21 wherein the mesas of the LEDs have a circular diameter of about 50 μm and wherein about 25 μm of n-metallization is present between mesas.

24. The compact array of claim 17 wherein the mesas of the LED's have a circular diameter of about 100 μm and wherein about 35 μm of n-metallization is present between mesas.

25. A LED of claim 1 wherein the LED, in cross-section, is provided with a rounded surface contour.

26. The LED of claim 25 wherein the LED shape, in cross-section, is parabolic.

27. The LED of claim 25 wherein the LED shape, in cross-section, is elliptical.

28. The LED of claim 25 wherein the LED shape, in cross-section, is hemispherical.

* * * * *